United States Patent [19]

Nishio

[11] Patent Number: 4,864,470
[45] Date of Patent: Sep. 5, 1989

[54] MOUNTING DEVICE FOR AN ELECTRONIC COMPONENT

[75] Inventor: Takashi Nishio, Yamanashi, Japan

[73] Assignees: Pioneer Electronic Corporation, Tokyo; Pioneer Video Corporation, Yamanashi, both of Japan

[21] Appl. No.: 234,118

[22] Filed: Aug. 18, 1988

[30] Foreign Application Priority Data

Aug. 31, 1987 [JP] Japan .......................... 62-131368[U]

[51] Int. Cl.$^4$ .......................... H05K 7/06; H02G 13/08
[52] U.S. Cl. .................................... 361/400; 174/52.2; 357/80; 361/403; 361/405; 361/417; 361/419
[58] Field of Search .................. 174/52.2, 52.3, 52.4; 357/80; 361/400, 401, 403–406, 408, 412, 417, 419–420

[56] References Cited

U.S. PATENT DOCUMENTS

| 4,218,701 | 8/1980 | Shirasaki | 357/80 |
| 4,509,096 | 4/1985 | Baldwin et al. | 361/403 |
| 4,604,644 | 8/1986 | Beckham et al. | 357/80 |
| 4,725,924 | 2/1988 | Juan | 357/80 |
| 4,734,818 | 3/1988 | Hernandez et al. | 361/403 |

Primary Examiner—Gregory R. Thompson
Attorney, Agent, or Firm—Sughrue, Mion, Zinn, Macpeak & Seas

[57] ABSTRACT

A surface acoustic wave (SAW) device is mounteed in such a manner that its functional surface faces a base plate and a space is formed therebetween to avoid inferiority in device characteristics. Electrodes of the SAW device and bumps formed on electrodes at predetermined positions of the base plate are connected to each other by applying pressure and heat to secure electrical continuity. A peripheral surface of the SAW device is bonded to the base plate by an adhesive to seal the functional surface of the SAW device.

10 Claims, 3 Drawing Sheets

MOUNTING DEVICE FOR AN ELECTRONIC COMPONENT

BACKGROUND OF THE INVENTION

The present invention relates to a mounting device of an electronic component such as a surface acoustic wave (SAW) device whose functional surface should not be touched by anything or clung to by an extraneous substance.

FIG. 5 shows a conventional "can package" in which a SAW device 7 is mounted. In FIG. 5, the reference numeral 1 designates a base plate (which is called a stem); 2, insulators; 3, a cap; 4, 5 and 6, electrode pins; 7, the SAW device; 8, an adhesive; and 9, bonding wires. The insulators 2 insulate the respective electrode pins 4, 5 and 6 from the base plate 1. The adhesive 8 sticks the SAW device 7 to the base plate 1. The bonding wires 9 connect the SAW device 7 to the electrode pins 4, 5 and 6. In manufacturing this can package, first the SAW device 7 is stuck to the base plate 1 by the adhesive 8, secondly the SAW device 7 is wire-bonded to the electrode pins, and then the base plate 1 is covered by the cap 3.

This can package has a problem in that it requires a relatively difficult process of connecting the SAW device 7 to the electrode pins 4, 5 and 6 through the electric wires 9. Besides, the package has another problem that a molten metal such as a sputtered substance is likely to cling to the surface of the SAW device 7 at the time of sealing the package with the cap 3, causing inferior characteristics, etc.

FIG. 6 shows another conventional package in which an acoustic vibrator 11 is mounted. In manufacturing this package, first the acoustic vibrator 11 is soldered to leads 12 and 13, secondly an upper internal case 14 and a lower internal case 15 are temporarily conjoined to each other with the leads 12 and 13 laid through the internal cases 14 and 15, and then the internal cases 14 and 15 are molded from their outside by plastic resin 34.

This type of package has a problem that it requires a relatively troublesome process of connecting the leads 12 and 13 to the acoustic vibrator 11 by soldering or the like.

SUMMARY OF THE INVENTION

The present invention has been made in order to solve the above-mentioned problems.

Accordingly, it is an object of the present invention to provide a mounting device in which an electronic component can be mounted without troublesome work of connecting the component to leads or wires and also without bringing such inferior characteristics as are caused by clinging of an extraneous substance to the functional surface of the component.

In the mounting device according to the invention, bumps necessary for the flip chip method are formed on electrodes provided at predetermined positions on a base plate. Electrode portions of the electronic component is put in contact with the bumps. Pressure and heat are then applied to the electrode portions of the electronic component and the bumps so that the electrodes and the bumps are connected to each other. The peripheral surface of the electronic component and the base plate are then hermetically stuck to each other by a setting type viscous substance. The electronic component is thus mounted on the base plate.

Since wire bonding is not needed in the invention, the reliability of the electronic component is not lowered by the wire bonding. Moreover, as a space of about several microns to several tens of microns is formed between the functional surface of the electronic component and the base plate, and the functional surface is sealed from the exterior, the extraneous substance is unlikely to cling to the functional surface, thereby preventing the occurrence of the inferiority in characteristics.

DETAILED DESCRIPTION OF THE PREFERRED EMBODIMENTS

Embodiments of the present invention will be described hereinafter in detail with reference to the accompanying drawings.

Figure 1:
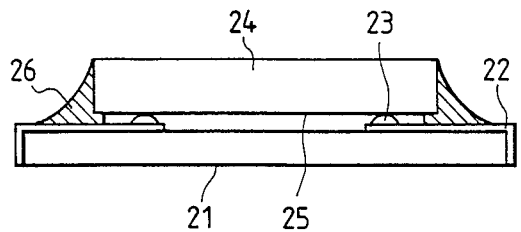
FIG. 1 shows a sectional view of a mounting device which is an embodiment of the present invention.
Figure 2:
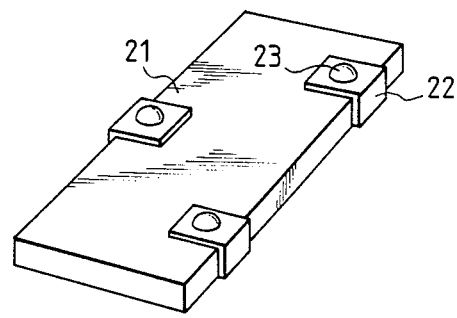
FIG. 2 shows a perspective view of a base plate shown in FIG. 1.
Figure 3:
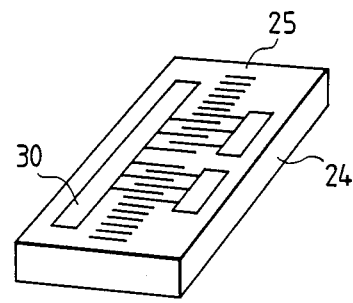
FIG. 3 shows a perspective view of a surface acoustic wave (SAW) device.

FIGS. 1, 2 and 3 show a mounting device which is one of the embodiments. Electrodes 22 are provided at prescribed positions on a base plate 21 made of ceramic or the like. Bumps 23 necessary for the flip chip method are formed on the electrodes 22. A surface acoustic wave (SAW) device 24 is placed on the base plate 21 so that a functional surface 25 (shown in FIG. 3) of the SAW device 24 faces down and electrodes 30 of the SAW device 24 are made coincident with the bumps 23 by mechanical positioning. Pressure and heat, which are strong enough to connect the electrodes 30 of the SAW device 24 and the bumps 23 to each other, are applied to the electrodes 30 and the bumps 23 so that they are electrically connected to each other. At that time, a space whose thickness is about several microns to several tens of microns and corresponds to the sum of the thickness of the electrode 22 and that of the deformed bump 23, is formed between a top surface of the base plate 21 and the functional surface 25 of the SAW device 24. After that, a viscous substance such as an adhesive which is made of an epoxy resin, a polyimide resin or the like and can be set, is poured around a peripheral surface of the SAW device 24 so that the peripheral surface of the SAW device 24 is bonded to the top surface of the base plate 21 and the space defined between the functional surface 25 and the top surface of the base plate 21 is sealed as the viscous substance is set.

At that time, the consistency of the viscous substance 26 should be thixotropic so that the substance does not enter into the above-mentioned space because of capilarity. It is appropriate from a standpoint of work efficiency that the viscous substance is of the setting type. Moreover, the gas permeability of the viscous substance 26 needs to be low enough to hermetically seal the space below the functional surface 25. In that respect, a frit glass paste or the like may be used as the viscous substance.

Although the pressure and the heat are applied to the electrodes 30 of the SAW device 24 and the bumps 23 to electrically connect them to each other by the flip chip method in the above-described embodiment, the present invention is not confined thereto but may be otherwise embodied with a viscous substance of shrink-set type. In this case the viscous substance is set with receiving pressure and secure electric connection can be achieved.

A viscous substance of some kind may be used to coat not only the peripheral surface of the SAW device 24 but also the top surface thereof opposite to the functional surface 25 to embed the SAW device 24 in the viscous substance.

Figure 4:
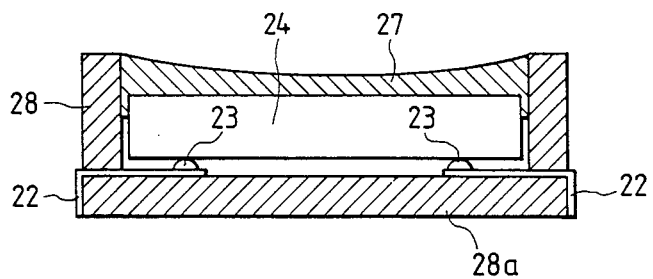
FIG. 4 shows a sectional view of a mounting device which is another embodiment of the present invention.
Figure 5:
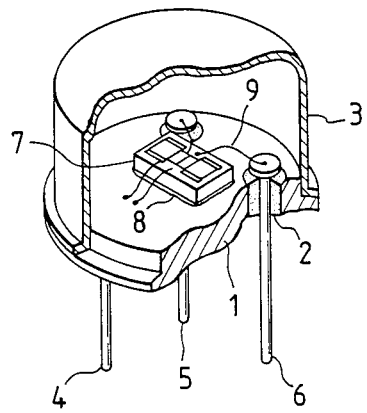
FIG. 5 shows a partially cutaway perspective view of a conventional mounting device of can package type.
Figure 6:
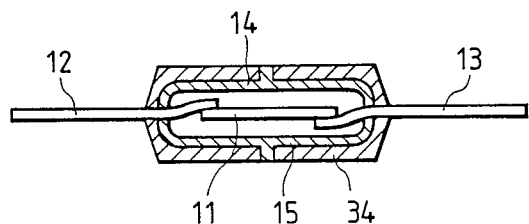
FIG. 6 shows a sectional view of a conventional mounting device of resin molding type.

FIG. 4 shows a mounting device which is the other one of the embodiments. A box-shaped base plate 28 of ceramic is provided in the device. Electrodes 22 are provided on positions extending from a top surface to a side surface of a bottom portion 28a of the base plate 28 through a side wall of the base plate 28. Bumps 23 are formed on the tip portions of the electrodes 22. A SAW device 24 is placed in the box-shaped base plate 28 so that a functional surface of the SAW device faces down. An adhesive or frit glass 27 is poured to fill a space above the top surface of the SAW device 24 so that the SAW device 24 is fixed to the base plate 28. The same effect as the mounting device shown in FIGS. 1, 2 and 3 is thus produced by the mounting device shown in FIG. 4.

What is claimed is:

1. A mounting device for an electronic component, comprising:
    a base plate having first electrodes at predetermined positions;
    bumps individually provided on said first electrodes;
    an electronic component having second electrodes each of which is directly and electrically connected to said bumps, and a functional surface which faces a top surface of said base plate;
    a space formed between said functional surface of said electronic component and said top surface of said base plate; and
    a viscous substances adhered to said electronic component and to said base plate in areas other than between said bumps and said electrodes, the dimensions of said space and the viscosity of said viscous substance being such that said viscous substance does not enter said space.

2. A mounting device as claimed in claim 1, wherein said viscous substance is stuck to a periphery of said electronic component and to top surface of said base plate so as to hermetically seal said space.

3. A mounting device as claimed in claim 1, wherein said electronic component is a surface acoustic wave (SAW) device.

4. A mounting device as claimed in claim 1, wherein said viscous substance is of a setting type.

5. A mounting device as claimed in claim 4, wherein said viscous substance is of a shrink-set type.

6. A mounting device as claimed in claim 1, wherein said viscous substance is a frit glass paste.

7. A mounting device as claimed in claim 1, wherein said second electrodes of said electronic component and said bumps are directly connected to each other as a result of applying pressure and heat thereto.

8. A mounting device as claimed in claim 1, wherein said base plate has a box-shape and said viscous substance is stuck to a top surface of said electronic component and to a side wall of said base plate so as to hermetically seal said space.

9. A mounting device as claimed in claim 8, wherein said electronic component is a SAW device.

10. A mounting device as claimed in claim 8, wherein said viscous substance is of a setting type.

* * * * *